United States Patent
Carlsson et al.

(10) Patent No.: US 10,965,296 B2
(45) Date of Patent: Mar. 30, 2021

(54) FREQUENCY SYNTHESIZER (71) Applicant: Telefonaktiebolaget LM Ericsson (publ), Stockholm (SE)

(72) Inventors: Anders Carlsson, Lund (SE); Staffan Ek, Lund (SE); Tony Påhlsson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/323,429

(22) PCT Filed: Aug. 9, 2016

(86) PCT No.: PCT/EP2016/068984
§ 371 (c)(1),
(2) Date: Feb. 5, 2019

(87) PCT Pub. No.: WO2018/028771
PCT Pub. Date: Feb. 15, 2018

(65) Prior Publication Data
US 2020/0195264 A1   Jun. 18, 2020

(51) Int. Cl.
*H03L 7/197* (2006.01)
*H03L 7/085* (2006.01)
*H03L 7/099* (2006.01)

(52) U.S. Cl.
CPC ............ *H03L 7/1976* (2013.01); *H03L 7/085* (2013.01); *H03L 7/0992* (2013.01); *H03L 7/1974* (2013.01)

(58) Field of Classification Search
CPC . H03L 7/18; H03L 7/183; H03L 7/197; H03L 7/1974; H03L 7/1976; H03L 7/199
See application file for complete search history.

(56) References Cited

U.S. PATENT DOCUMENTS 5,834,987 A * 11/1998 Dent .................... H03C 3/0925
                                                    332/127
5,983,077 A * 11/1999 Dent .................... H03C 3/0925
                                                    332/128
(Continued)

FOREIGN PATENT DOCUMENTS

EP   0948138 A1   6/1999
WO   0161858 A1   8/2001

OTHER PUBLICATIONS

Adachi, Hisashi, et al., "High-Speed Frequency-Switching Synthesizer Using Fractional N Phase-Locked Loop", Electronics and Communications in Japan (Part II Electronics), vol. 77, No. 4, Apr. 1994, 20-28.

(Continued)

*Primary Examiner* — Levi Gannon
(74) *Attorney, Agent, or Firm* — Patent Portfolio Builders, PLLC (57) ABSTRACT

A fractional-N frequency synthesizer circuit is disclosed. It comprises a frequency divider circuit configured to receive a first oscillation signal having a first frequency, to receive a control word indicating a divisor, and to frequency divide the first oscillation signal with the divisor to generate a second oscillation signal having a second frequency, lower than the first frequency. It also comprises a modulator circuit configured to generate a sequence of control words to the frequency divider circuit. The modulator circuit comprises a set of memory elements configured to store an internal state of the modulator circuit in response to a first control signal and to restore the internal state of the modulator circuit in response to a second control signal, thereby enabling a time shift of the sequence of control words. A communication circuit, a communication apparatus, and a method are also disclosed.

16 Claims, 7 Drawing Sheets

(56) References Cited

U.S. PATENT DOCUMENTS

| | | | | |
|---|---|---|---|---|
| 6,211,747 | B1* | 4/2001 | Trichet | H03C 3/0925 |
| | | | | 332/128 |
| 7,215,214 | B1* | 5/2007 | Taheri | H03B 5/04 |
| | | | | 310/315 |
| 8,537,952 | B1* | 9/2013 | Arora | H03C 3/0925 |
| | | | | 375/354 |
| 10,224,940 | B2* | 3/2019 | Sjoland | H03L 7/081 |
| 2002/0012412 | A1* | 1/2002 | Maeda | H03L 7/1974 |
| | | | | 375/376 |
| 2003/0039330 | A1* | 2/2003 | Castiglione | H03L 7/0898 |
| | | | | 375/376 |
| 2008/0074201 | A1 | 3/2008 | Henzler et al. | |
| 2009/0289730 | A1 | 11/2009 | Kawamura | |
| 2015/0276919 | A1 | 10/2015 | Matsumura | |

OTHER PUBLICATIONS

Hosseini, Kaveh, "Maximum Sequence Length MASH Digital Delta—Sigma Modulators", IEEE Transactions on Circuits and Systems I: Regular Papers, vol. 54, No. 12, Dec. 2007, 1-11.

Xu, Tao, et al., "Chapter 2—MASH Digital Delta—Sigma Modulator with Multi-Moduli", Electronic Engineering and Computing Technology, Springer, 2010, 13-24.

Xu, Zule, et al., "Self-Dithered Digital Delta-Sigma Modulators for Fractional-N PLL", IEICE Transactions on Electronics, 2011, 1-4.

* cited by examiner

FREQUENCY SYNTHESIZER

CROSS-REFERENCE TO RELATED APPLICATION

This application is a U.S. National Stage Filing under 35 U.S.C. § 371 of International Application No. PCT/EP2016/068984, filed on Aug. 9, 2016, the disclosure of which is fully incorporated herein by reference.

TECHNICAL FIELD

The present invention relates to a frequency synthesizer.

BACKGROUND

It is foreseen that 5G (5th Generation) cellular systems will use millimeter waves. The frequencies currently in discussion range from about 15 to 60 GHz. In order to use the system outdoors, a longer cyclic prefix should preferably be used compared with recently released 60 GHz indoor systems, resulting in use of a closer sub-carrier spacing in the OFDM modulation. This results in relatively stringent phase noise requirements. Furthermore, the use of beamforming employing a relatively large number of antenna elements has also been proposed to increase the range and capacity of the system.

In, for instance, a system as outlined above, implementation of the local oscillator (LO) generation circuitry is challenging. For instance, it is desirable to distribute LO signals to all transceivers in such a beamforming system without consuming excessive power. Generating the LO signals locally, in frequency synthesizers distributed close to the transceivers, is a possible approach. These frequency synthesizers can be driven with, or synchronized to, a common reference oscillator, such as a crystal oscillator. Furthermore, as outlined above, a low phase noise is generally desired.

Fractional-N frequency synthesizers, such as fractional-N phase-locked loops (PLLs), are suitable for generation of LO signals with relatively high frequency resolution. Such a fractional-N frequency synthesizer typically includes a frequency divider driven by an integer frequency divisor. By varying the value of the integer frequency divisor in time, an average non-integer frequency divisor is obtained. A suitable sequence of integer frequency divisors can for instance be generated by a modulator circuit, such as a delta-sigma modulator. The phase noise of an LO signal generated by such a fractional-N frequency synthesizer originates at least partly from the modulation of the frequency divisor.

To obtain a relatively low overall signal impairment due to phase noise, it is desirable that the phase noise of different transceivers have relatively low correlation. Thus, it is desirable that the phase noise of the LO signals generated by different fractional-N frequency synthesizers have relatively low mutual correlation.

SUMMARY

One possible approach to obtaining a relatively low correlation of the phase noise is to use the same modulated sequence of frequency divisors, represented with a sequence of control words, in the different fractional-N frequency synthesizers, but shifting the sequence in time with a different amount for different fractional-N frequency dividers.

The inventors have realized that generating a sequence of control words for a frequency divider in a frequency synthesizer using a modulator circuit having memory elements for storing and restoring an internal state of the modulator provides an efficient circuit realization for shifting such a sequence in time.

According to a first aspect, there is provided a fractional-N frequency synthesizer circuit. It comprises a frequency divider circuit configured to receive a first oscillation signal having a first frequency, to receive a control word indicating a divisor, and to frequency divide the first oscillation signal with the divisor to generate a second oscillation signal having a second frequency, lower than the first frequency. It also comprises a modulator circuit configured to generate a sequence of control words to the frequency divider circuit. The modulator circuit comprises a set of memory elements, configured to store an internal state of the modulator circuit in response to a first control signal and to restore the internal state of the modulator circuit in response to a second control signal, thereby enabling a time shift of the sequence of control words.

The modulator circuit may be configured to set the internal state to a default state in response to a reset signal.

The frequency synthesizer circuit may comprise a set of delay elements. The internal state may be represented with the contents of the delay elements in said set of delay elements.

For each delay element in the set of delay elements, the set of memory elements may comprise an associated memory element connected to that delay element and configured to store the content of that delay element in response to the first control signal.

The frequency synthesizer circuit may comprise a set of multiplexers. For each delay element in the set of delay elements, the set of multiplexers may comprise an associated multiplexer connected to an input of that delay element and configured to supply the content of the associated memory element to the input of the delay element in response to the second control signal.

The frequency synthesizer circuit may be a phase-locked loop (PLL) circuit comprising a controllable oscillator configured to generate the first oscillation signal and a phase detector configured to receive the second oscillation signal at a first input and to receive a reference oscillation signal at a second input.

According to a second aspect, there is provided a communication circuit comprising the frequency synthesizer circuit according to the first aspect for generating a local oscillator signal of the communication circuit.

The communication circuit may for instance be a transmitter circuit, a receiver circuit, or a transceiver circuit.

According to a third aspect, there is provided a communication apparatus comprising a plurality of communication circuits according to the second aspect.

The communication apparatus may comprise a control circuit configured to supply the first control signal and the second control signal, with a time delay between them, to the modulator circuit of the frequency synthesizer circuit in each communication circuit with different time delays for different communication circuits.

For instance, the control circuit may be configured to supply the first control signal to each of the modulator circuits at the same time instant, and supply the second control signal to different modulator circuits at different time instants. Alternatively, the control circuit may be configured to supply the first control signal to different modulator circuits at different time instants, and supply the second control signal to each modulator circuit at the same time instant.

The communication apparatus may e.g. be a radio base station for a cellular communications system.

According to a fourth aspect, there is provided a method of controlling the communication apparatus according to the third aspect. The method comprises supplying the first control signal and supplying the second control signal, with a time delay between them, to the modulator circuit of the frequency synthesizer circuit in each communication circuit with different time delays for different communication circuits.

In some embodiments, supplying the first and the second control signals comprises supplying the first control signal to each of the modulation circuits at the same time instant and supplying the second control signal to different modulation circuits at different time instants.

In some embodiments, supplying the first and the second control signals comprises supplying the first control signal to different modulation circuits at different time instants and supplying the second control signal to each of the modulation circuits at the same time instant.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
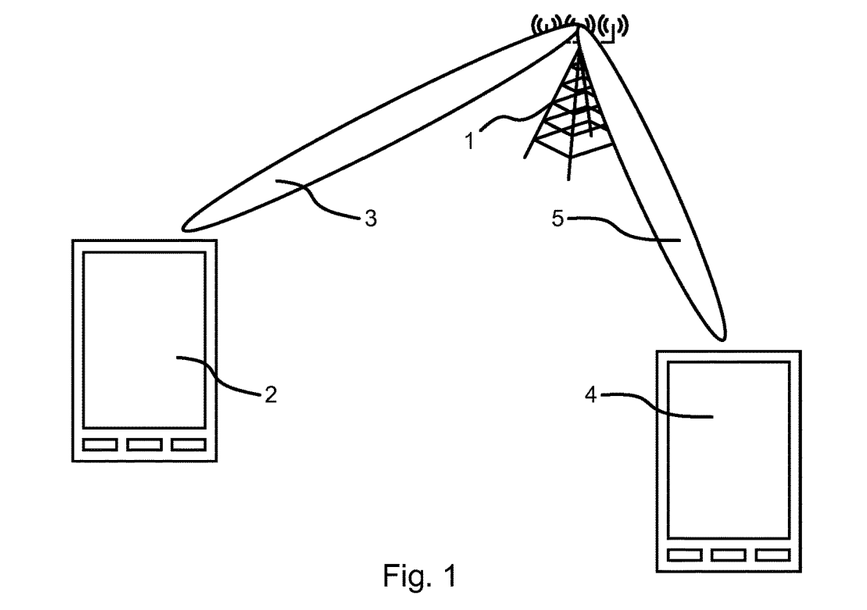
FIG. 1 illustrates a communication environment.

FIG. 1 illustrates a communication environment wherein embodiments of the present invention may be employed. A radio base station 1 of a cellular communications system is in wireless communication with a wireless device 2 via a beam 3 and a wireless device 4 via another beam 5. The wireless devices 2 and 4 are depicted in FIG. 1 as mobile phones, but may be any kind of devices with cellular communication capabilities, such as tablet or laptop computers, machine-type communication (MTC) devices, or similar. Furthermore, a cellular communications system employing beamforming is used as an example throughout this disclosure. However, embodiments of the present invention may be applicable in other types of systems as well, such as but not limited to WiFi systems.

The radio base station 1 and wireless devices 2 and 4 are examples of what in this disclosure is generically referred to as communication apparatuses. Embodiments are described below in the context of a communication apparatus in the form of the radio base station 1. However, other types of communication apparatuses can be considered as well, such as wireless devices 2 and 4, a WiFi access point, etc.

Figure 2:
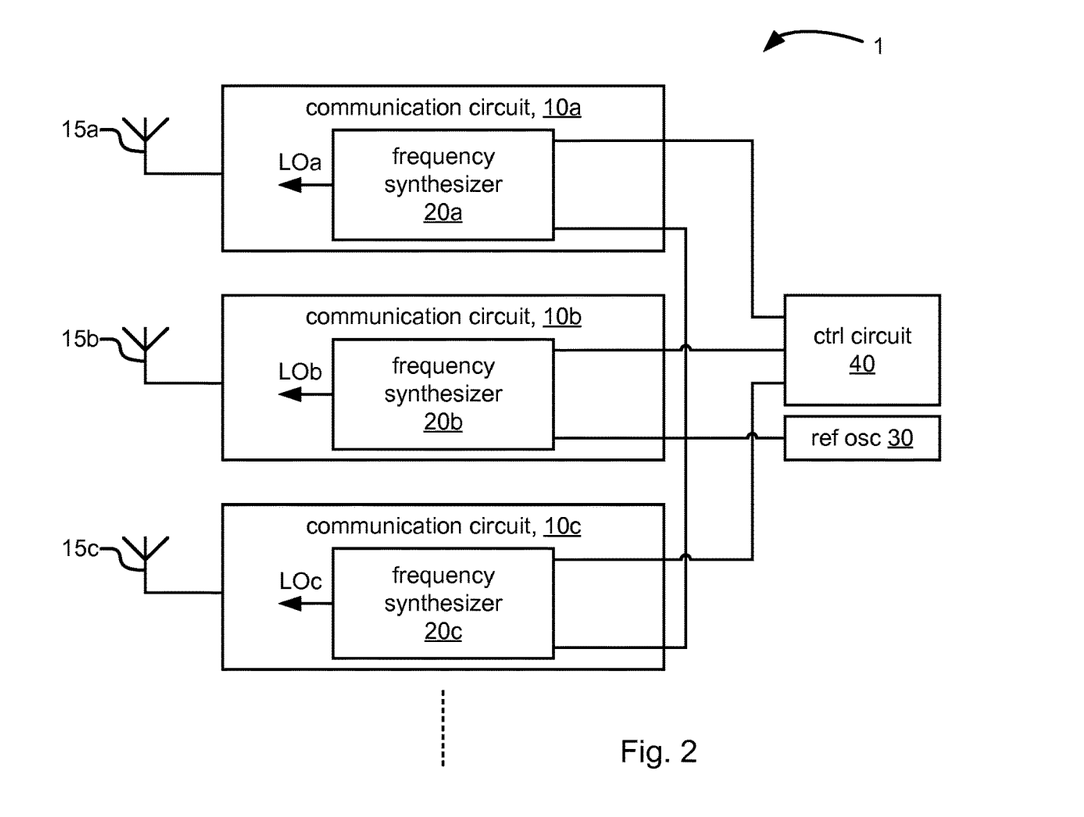
FIGS. 2-10 show block diagrams.

FIG. 2 schematically illustrates an embodiment of the radio base station 1. To enable beamforming, the radio base station 1 comprises a plurality of communication circuits 10a-c. Beamforming can be used both for receiving and transmitting. Thus, in some embodiments, the communication circuits 10a-c are transmitter circuits. In some embodiments, the communication circuits 10a-c are receiver circuits. In some embodiments, the communication circuits 10a-c are transceiver circuits. For simplicity, only three communication circuits 10a-c are shown in FIG. 2. However, as indicated by the dotted line, any number of communication circuits may be included. Each communication circuit 10a-c is connected to an associated antenna 15a-c. Furthermore, each communication circuit 10a-c comprises a fractional-N frequency synthesizer 20a-c, configured to generate an LO signal LOa-c of the communication circuit. The LO signals LOa-c may be used to drive a down-conversion mixer (e.g. in a receiver circuit), an up-conversion mixer (e.g. in a transmitter circuit), or both (e.g. in a transceiver circuit). For simplicity, reference is made below to the fractional-N frequency synthesizers using the shorter term "frequency synthesizers".

In FIG. 2, the radio base station 1 comprises a reference oscillator 30, such as a crystal oscillator (XO), e.g. a voltage controlled XO (VCXO), for generating a reference oscillation signal with a stable reference frequency. In FIG. 2, all of the frequency synthesizers 20a-c are connected to the reference oscillator 30 for receiving the same reference oscillation signal. Furthermore, in FIG. 2, the radio base station 1 comprises a control circuit 40. In some embodiments, the control circuit 40 is configured to control the mutual delays, or time shifts, between sequences of control words, representing frequency divisors, in the frequency synthesizers 20a-c. Examples of this are described in further detail below.

According to embodiments, a frequency synthesizer circuit, such as 20a-c, comprises a frequency divider circuit configured to receive a first oscillation signal having a first frequency, to receive a control word indicating a divisor, and to frequency divide the first oscillation signal with the divisor to generate a second oscillation signal having a second frequency, lower than the first frequency. Furthermore, the frequency synthesizer circuit comprises a modulator circuit configured to generate a sequence of control words to the frequency divider circuit. The modulator circuit comprises a set of memory elements configured to store an internal state of the modulator circuit in response to a first control signal and to restore the internal state of the modulator circuit in response to a second control signal. Thereby, shifting the sequence of control words in time is enabled.

Figure 3:
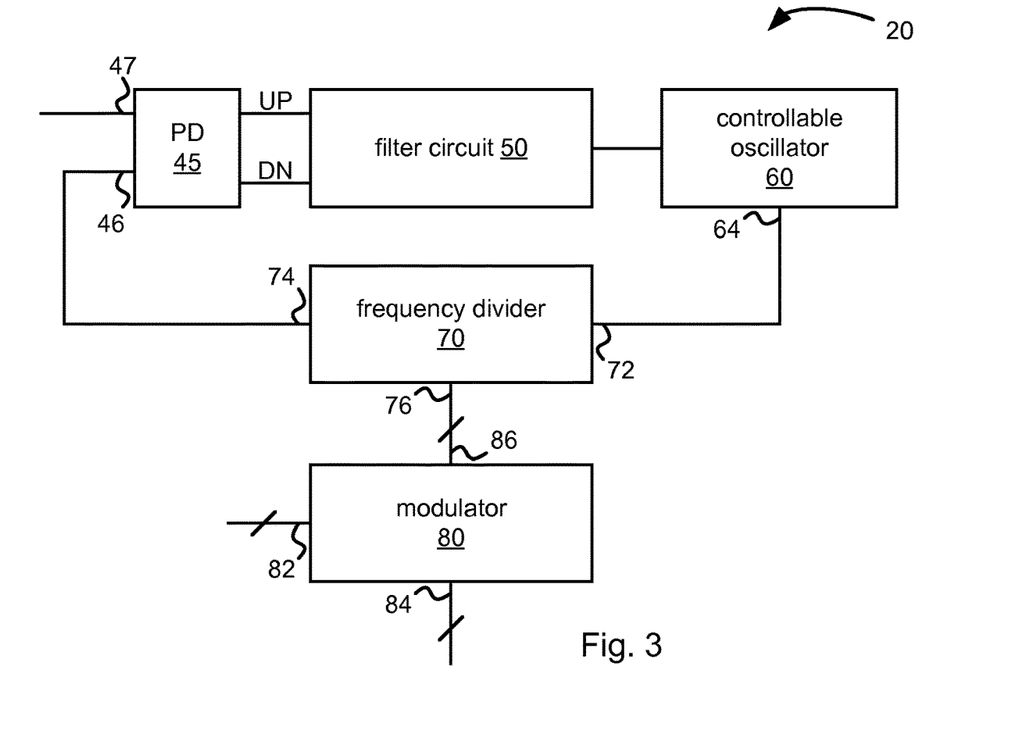

FIG. 3 shows a block diagram of an example embodiment of a frequency synthesizer 20. The frequency synthesizers 20a-c (FIG. 2) may be implemented as the frequency synthesizer 20 in FIG. 3. The frequency synthesizer 20 shown in FIG. 3 is merely an example. Other frequency synthesizer structures may be employed as well, as would be readily appreciated by a person skilled in the art of frequency synthesizer design.

The frequency synthesizer circuit 20 depicted in FIG. 3 is what is commonly referred to as a phase-locked loop (PLL). It comprises a controllable oscillator 60 configured to generate the aforementioned first oscillation signal on an output 64. The controllable oscillator 60 may e.g. be a voltage-controlled oscillator (VCO) or a digitally-controlled oscillator (DCO). The frequency divider circuit has reference number 70. It has an input 72 for receiving the first oscillation signal. It also has an output 74 for outputting the second oscillation signal. Furthermore, it has an input port 76 for receiving said control word representing the divisor. The modulator circuit has reference number 80. It has a control port 82 for receiving the first and second control signals. Furthermore, it has an input port 84 for receiving an input word representing a target non-integer divisor, i.e. a target average value for the sequence of divisors represented by the sequence of control words to be provided to the frequency divider 70. The modulator circuit 80 also has an output port 86 for outputting said sequence of control words to the frequency divider 70.

In FIG. 3, the frequency synthesizer circuit 20 comprises a phase detector 45 configured to receive the second oscillation signal at a first input 46 and to receive the reference oscillation signal at a second input 47. The phase detector 45 depicted in the embodiment illustrated in FIG. 3 is configured to generate UP or DOWN (DN) signals (or pulses) depending on a phase difference between the reference oscillation signal and the second oscillation signal, according to principles well known by a person skilled in the art of PLL design. Other types of phase detectors, e.g. implemented with AND gates or multipliers, may be used as well in other embodiments. The UP and DN pulses are provided to a filter circuit 50 of the frequency synthesizer circuit 20. The filter circuit 50 is configured to generate a control signal to the controllable oscillator 60 for controlling the frequency of the first oscillation signal. The filter circuit 50 may e.g. comprise a charge pump arranged to be controlled by the UP and DN pulses, and a loop filter connected to an output of said charge pump. The principles of PLL design are well known in the art, so this is not further discussed in any more detail herein.

Returning to FIG. 2, according to some embodiments, the control circuit 40 is configured to control the modulator circuit 80 of each frequency synthesizer 20*a-c* by supplying said first and second control signals to the modulator circuit 80. By supplying the first control signal and the second control signal with a time delay between them, the sequence of control words generated by the modulator circuit 80 is delayed with the same amount. Assuming that, initially, the modulator circuits 80 of the different frequency synthesizers 20*a-c* are synchronized, i.e. generate the same sequence of control words without any mutual time shifts, a mutual time shift between the modulator circuits 80 can be introduced by the control circuit 40 by using different time delays between the first and the second control signal for different communication circuits 10*a-c*. For example, a first time delay between the first and second control signal may be used for the modulator circuit 80 of the frequency synthesizer 20*a* of the communication circuit 10*a*. Furthermore, a second time delay between the first and second control signal may be used for the modulator circuit 80 of the frequency synthesizer 20*b* of the communication circuit 10*b*. Moreover, a third time delay between the first and second control signal may be used for the modulator circuit 80 of the frequency synthesizer 20*c* of the communication circuit 10*c*, and so on. The first, second, third, and further time delays may all be different.

There are different options for achieving this. In some embodiments, the control circuit 40 is configured to supply the first control signal to each of the modulator circuits 80 at the same time instant, and supply the second control signal to different modulator circuits 80 at different time instants. In other embodiments, the control circuit 40 is configured to supply the first control signal to different modulator circuits 80 at different time instants, and supply the second control signal to each modulator circuit 80 at the same time instant.

Figure 4:
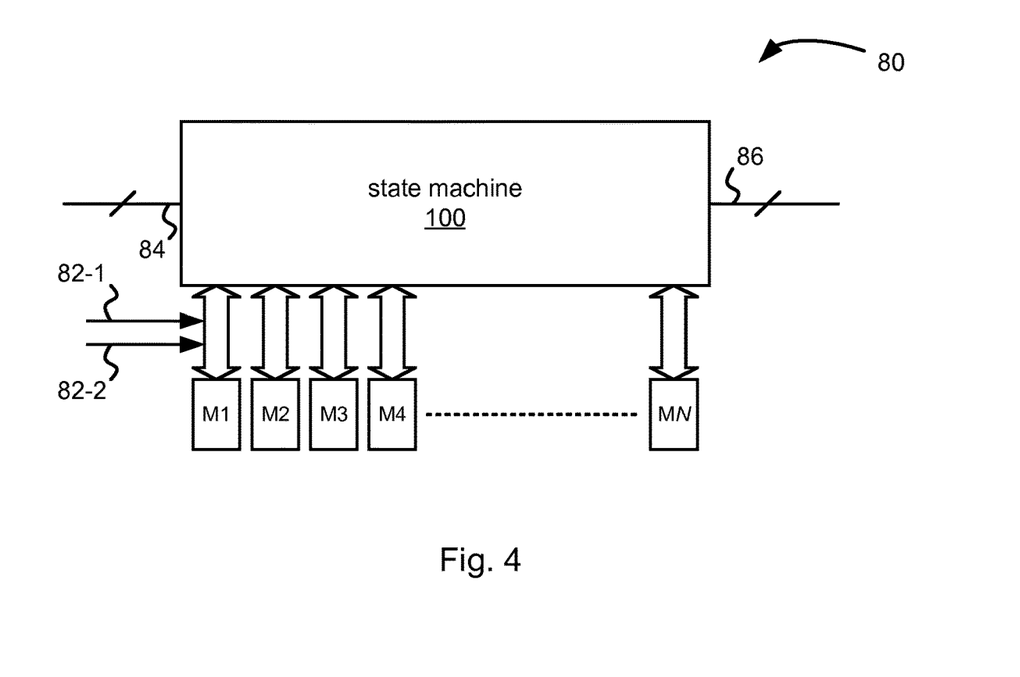

FIG. 4 is a generic block diagram of the modulator circuit 80 according to some embodiments. It comprises a state machine 100, such as a finite state machine, configured to generate the sequence of control words on the output port 86. Furthermore, in FIG. 4, the state machine 100 is configured to receive the input word representing a target non-integer divisor provided at the input port 84. The aforementioned memory elements configured to store the internal state of the modulator circuit 80 in response to the first control signal and to restore the internal state of the modulator circuit 80 in response to the second control signal are labeled M1-MN in FIG. 4. Furthermore, in FIG. 4, individual control inputs 82-1 and 82-2 of the control port 82 are indicated. The control input 82-1 is used for the first control signal and the control input 82-2 is used for the second control signal. In FIG. 4, and in the following FIG. 5, the memory elements M1-MN are single-bit memory elements. The internal state of the modulator circuit 80, at any given instant, is represented with an N-bit word within the state-machine 100. In response to the first control signal, this N-bit word is read out and stored by the memory elements M1-MN. In response to the second control signal, the N-bit word is restored to the content of the memory elements M1-MN. Thereby, the internal state of the modulator circuit 80 is restored to the value it had when the first control signal was applied. Consequently, the sequence of control words output on output port 86 has been shifted back in time.

Figure 5:
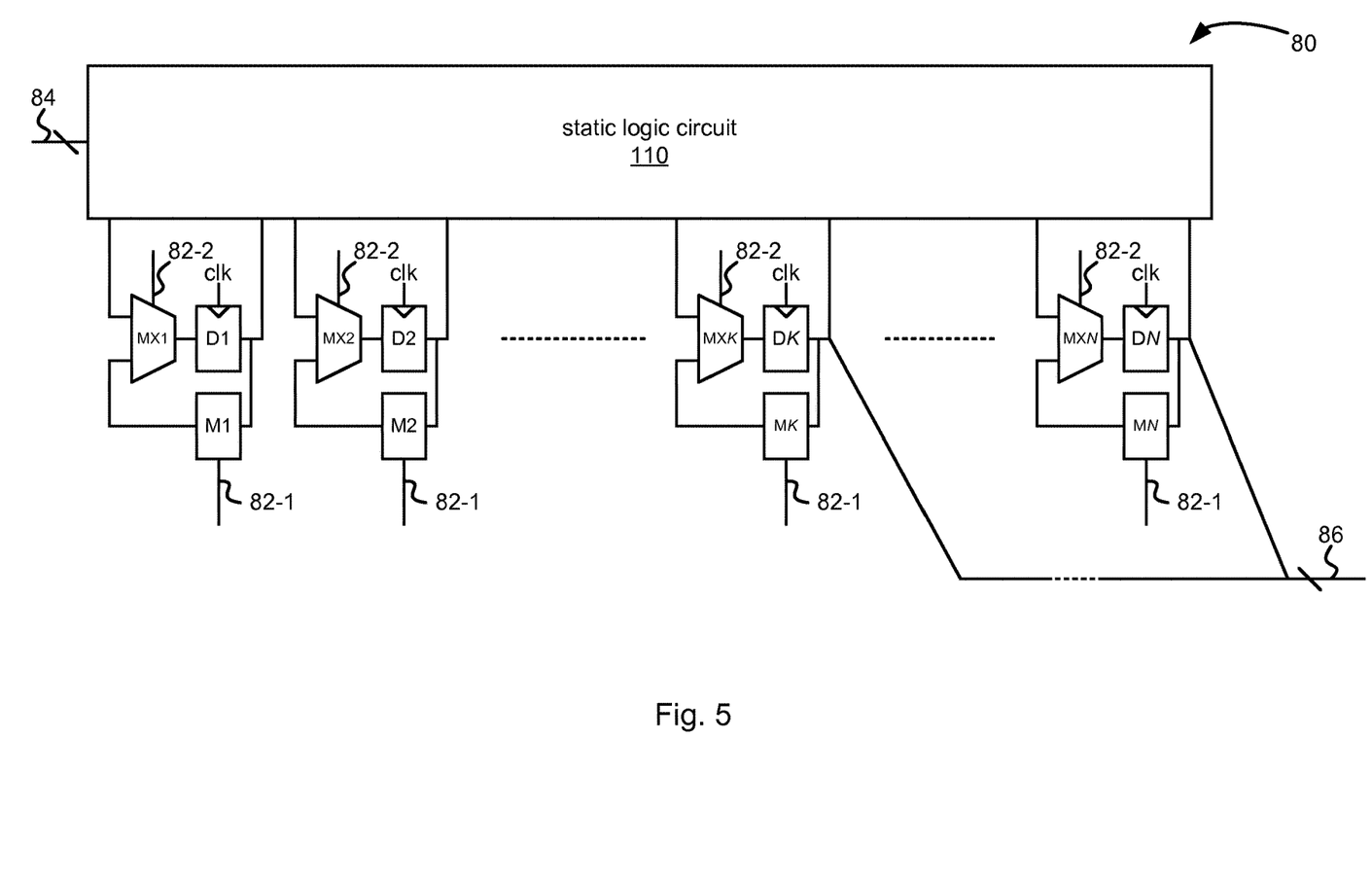

According to some embodiments, the modulator circuit 80 comprises a set of delay elements, wherein the internal state of the modulator circuit 80 is represented with the contents of the delay elements. Furthermore, in some embodiments, the set of memory elements M1-MN comprises, for each delay element in the set of delay elements, an associated memory element M1-MN connected to that delay element and configured to store the content of that delay element in response to the first control signal. This is illustrated with an embodiment in FIG. 5. In FIG. 5, the modulator circuit 80 comprises a static logic circuit 110 and delay elements D1-DN. The delay elements D1-DN may e.g. be flip-flops, such as D flip flops. In examples provided in this disclosure, the delay elements are clocked with a clock signal clk at a sample rate of the modulator circuit 80. The memory elements M1-MN may also be implemented with flip flops, such as D flip flops, which can be clocked by the second control signal. According to some embodiments, the static logic circuit 110 and the delay elements D1-DN can be viewed as together forming the state machine 100 (FIG. 4). For each delay element Di, there is an associated memory element Mi connected to that delay element Di and configured to store the content of that delay element Di in response to the first control signal, provided at control input 82-1. As in FIG. 4, the memory elements M1-MN, as well as the delay elements D1-DN, are single-bit elements.

In FIG. 5, the static logic circuit 110 is configured to receive the input word representing the target non-integer divisor provided at the input port 84. Furthermore, in FIG. 5, the control word output on output port 86 forms part of the internal state of the modulator circuit 80, and its bits are stored in delay elements DK-DN. In other embodiments, the control word output on output port 86 may be output directly from the static logic circuit 110 and not form part of the internal state of the modulator. This is for example the case in the example described below with reference to FIGS. 6-9.

According to some embodiments, the modulator circuit 80 comprises a set of multiplexers, for facilitating the restoring of the state in response to the second control signal. For example, for each delay element in the set of delay elements, the set of multiplexers may comprise an associated multiplexer connected to an input of that delay element and configured to supply the content of the associated memory element to the input of the delay element in response to the second control signal. This is illustrated in FIG. 5 as well. In FIG. 5, there is an associated multiplexer MXi for each delay element Di. In normal operation, i.e. when there is no restore operation going on, the multiplexer MXi connects an output of the static logic circuit 110 as an input to the delay element Di, which is subsequently fed back by the delay element Di as an input to the static logic circuit 110. In response to the second control signal, provided at control input 82-2, the multiplexer MXi instead connects an output of the memory element Mi to the input of the delay element Di. Thereby the state previously stored in the memory elements M1-MN is restored.

Figure 6:
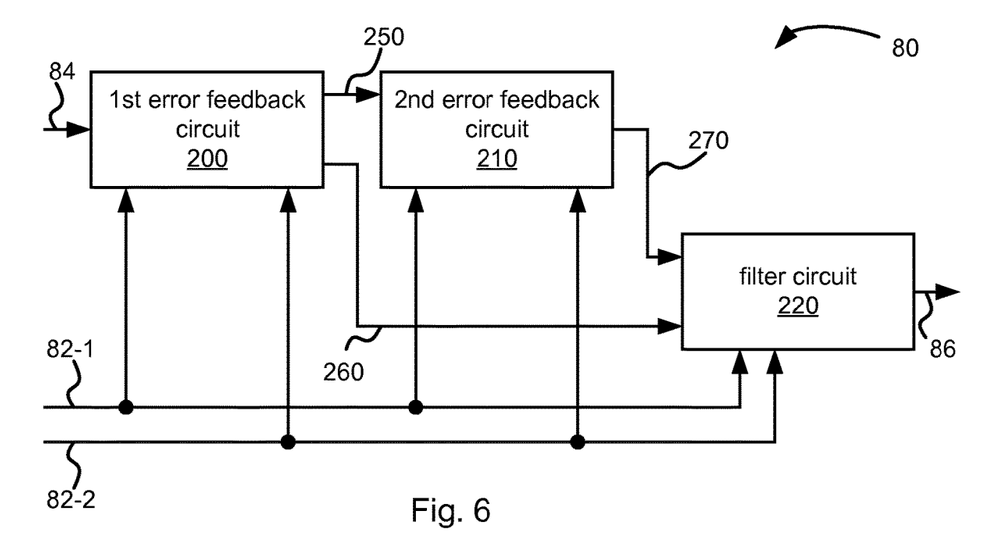

According to some embodiments, the modulator circuit 80 is a so called delta sigma modulator circuit. FIGS. 6-9 outlines an example of this, wherein the modulator circuit is an error-feedback modulator. As illustrated in FIG. 6, this embodiment of the modulator circuit comprises a first error feedback circuit 200, a second error feedback circuit 210, and a filter circuit 220.

In FIG. 6, the first error feedback circuit 200 is configured to receive the input word representing the target non-integer divisor provided at the input port 84. Furthermore, in FIG. 6, a first output of the first error feedback circuit 200 is provided as an input to the second error feedback circuit 210 via a connection 250. Moreover, in FIG. 6, a second output of the first error feedback circuit 200 is provided as an input to the filter circuit 220 via a connection 260. A skilled person would recognize the second output of the first error feedback circuit 200 as a quantized output, and the first output of the first error feedback circuit 200 as residual output, respectively.

In FIG. 6, an output of the second error feedback circuit 210 is provided as an input to the filter circuit 220 via a connection 270. The filter circuit 220 is configured to combine the second output from the first error feedback circuit 200 and the output from the second error feedback circuit 210 to form the sequence of control words to be output on the output port 86 of the modulator circuit 80.

In FIG. 6, as well as FIGS. 7-9 described below, signals other than the first and second control signal and clock signals, are multi-bit signals. Thus, in FIGS. 7-9, depicted elements such as delay elements, multiplexers, and memory elements are multi-bit elements.

Figure 7:
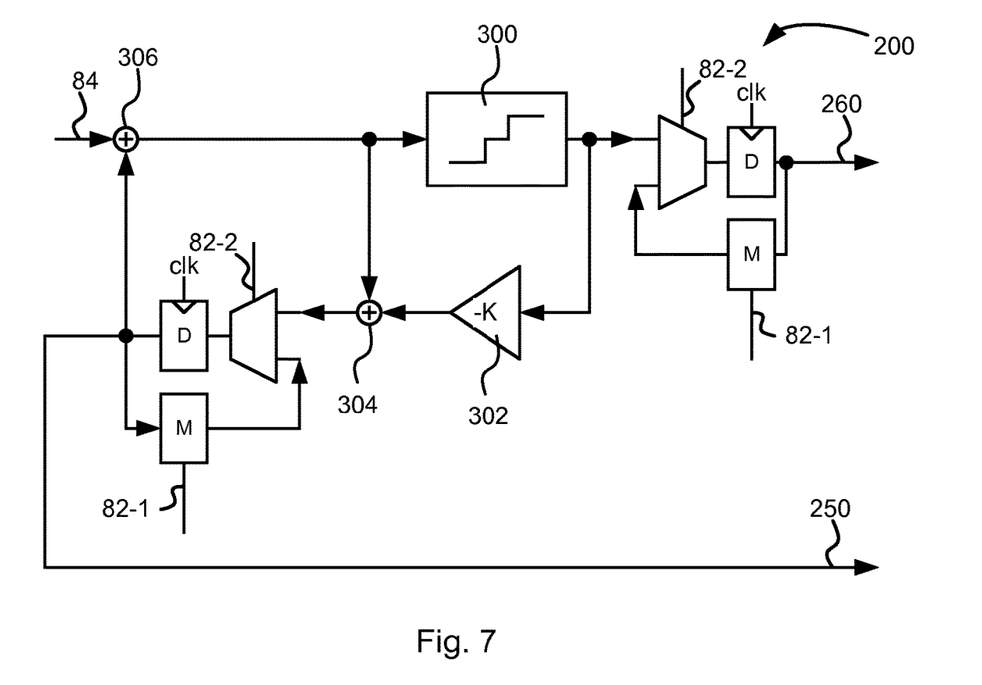

FIG. 7 is a block diagram of the first error feedback circuit 200 according to an example embodiment. In addition to delay elements, multiplexers, and memory elements, the embodiment of the first error feedback circuit 200 shown in FIG. 7 comprises a quantizer 300, a constant coefficient multiplier 302, and adders 304 and 306. Referring to FIG. 5, the quantizer 300, constant coefficient multiplier 302, and adders 304 and 306 of FIG. 7 form part of the static logic circuit 110. The function of the quantizer 300 is to output a quantized version of its input, i.e. with lower resolution. In the example in FIG. 7, the quantizer 300 is a three-level quantizer (i.e. with three different output levels), which is suitable for use with signed arithmetic. If unsigned arithmetic is used instead, a two-level quantizer is a suitable alternative for the quantizer 300. The coefficient K of the constant coefficient multiplier 302 can be selected in order to obtain a desired quantization noise shaping, e.g. based on simulations.

Figure 8:
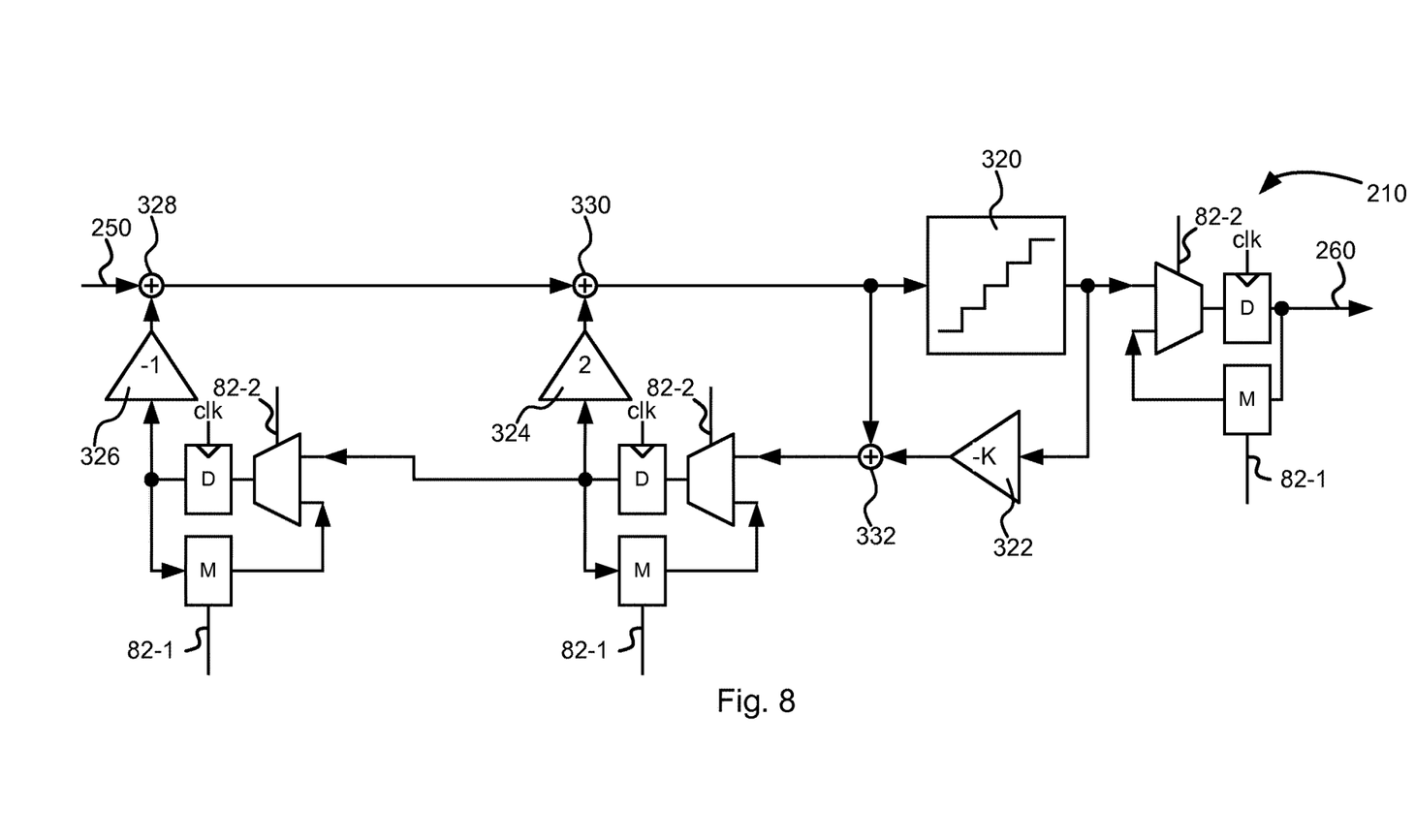

FIG. 8 is a block diagram of the second error feedback circuit 210 according to an example embodiment. In addition to delay elements, multiplexers, and memory elements, the embodiment of the second error feedback circuit 210 shown in FIG. 8 comprises a quantizer 320, constant coefficient multipliers 322, 324, and 326, and adders 328, 330, and 332. Referring to FIG. 5, the quantizer 320, constant coefficient multipliers 322, 324, and 326, and adders 328, 330, and 332 of FIG. 8 form part of the static logic circuit 110. The function of the quantizer 320 is to output a quantized version of its input, i.e. with lower resolution. In the example in FIG. 8, the quantizer 320 is a five-level quantizer (i.e. with five different output levels), which is suitable for use with signed arithmetic. If unsigned arithmetic is used instead, a four-level quantizer is a suitable alternative for the quantizer 320. The coefficient K of the constant coefficient multiplier 322 can be selected in order to obtain a desired quantization noise shaping, e.g. based on simulations. The coefficient K of the multiplier 322 and the coefficient K of the multiplier 302 (FIG. 7) are not the same coefficient. Hence they can have different values, but may have the same value in some embodiments.

Figure 9:
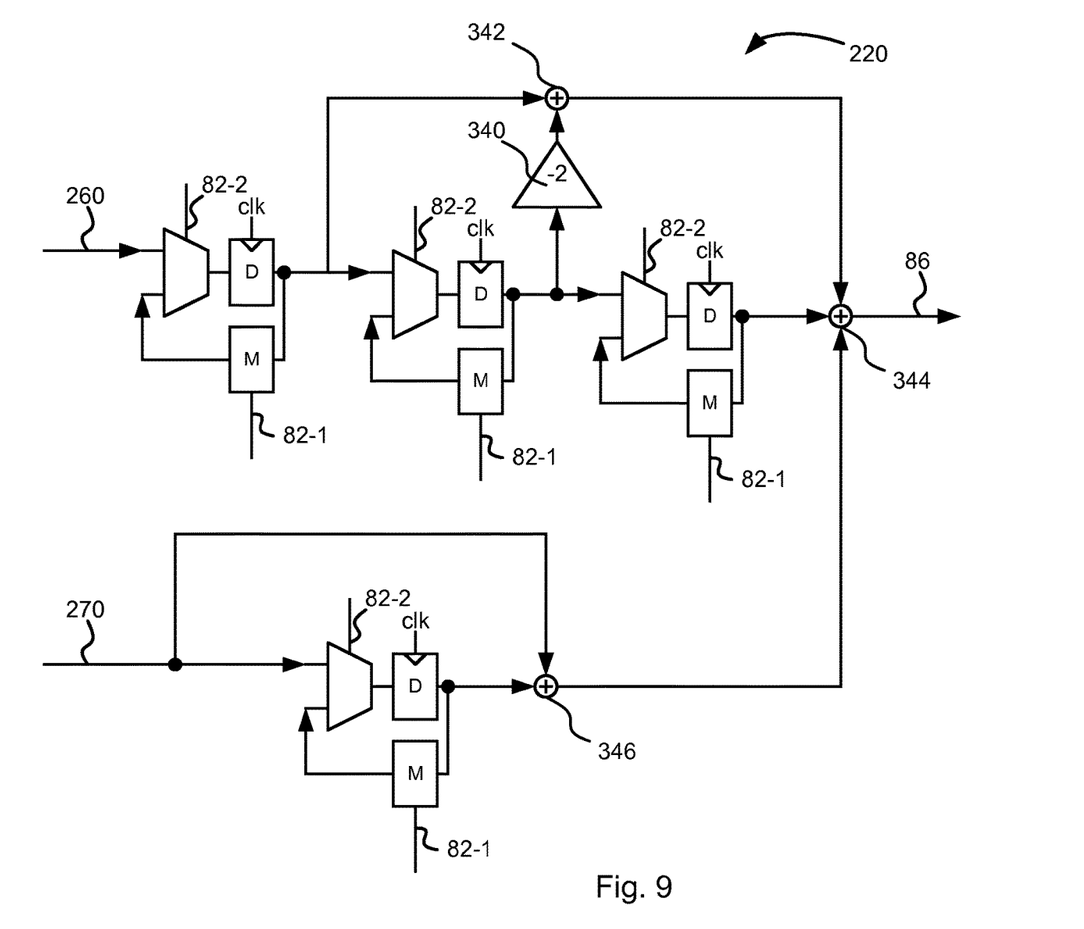

FIG. 9 is a block diagram of the filter circuit 220 according to an example embodiment. In addition to delay elements, multiplexers, and memory elements, the embodiment of the filter circuit 220 shown in FIG. 9 comprises a constant coefficient multiplier 340 and adders 342, 344, and 346. Referring to FIG. 5, the constant coefficient multiplier 340 and adders 342, 344, and 346 of FIG. 9 form part of the static logic circuit 110.

It can be seen from the example in FIGS. 6-9 that the additional hardware overhead, in terms of multiplexers and memory elements, required for enabling the time shifting of the sequence of control words is relatively low. At the same time, it enables a time shift with an arbitrary number of samples. In some applications considered by the inventors, a time shift of in the order of thousands of samples is envisioned. An alternative solution that can be considered is to introduce a chain of delay elements at the output of a modulator circuit. The length of such a chain would correspond to the maximum number of samples of time shift desired. Compared with this alternative solution, it is readily seen that the hardware efficiency of the embodiments proposed in this disclosure is better, especially for large desired time shifts.

Figure 10:
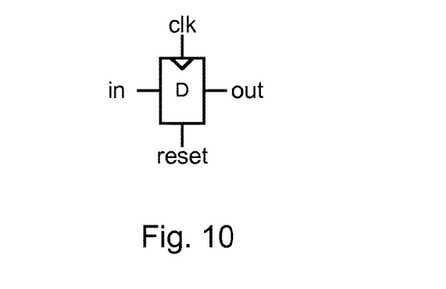

According to some embodiments, the modulator circuits 80 of the different frequency synthesizers 20a-c are initially (i.e. before application of the first control signal) synchronized, such that they all have the same internal state simultaneously. This can be accomplished in many different ways. For example, in some embodiments, the modulator circuit 80 is configured to set the internal state to a default state in response to a reset signal. This can e.g. be implemented by designing the delay elements as resettable delay elements, which are configured to enter a default state in response to the reset signal. This is illustrated with an embodiment in FIG. 10, showing a delay element that, in addition to in, out, and clock terminals, has a terminal for receiving the reset signal. Such a reset signal may e.g. be supplied by the control circuit 40 to the modulator circuits 80 of all frequency synthesizers 20a-c simultaneously. In other embodiments, the modulator circuit 80 may be designed to enter a known well-defined state at startup, such that the modulator circuits 80 in all frequency synthesizers 20a-c all start up in the same state. In other embodiments, the modulator circuit 80 may have a programmable state. For example, the modulator circuit 80 may have an interface, such as a serial interface, through which the state of the modulator circuit 80 can be programmed to an arbitrary state. The control circuit 40 can then be configured to program the modulator circuits 80 of all frequency synthesizers 20a-c to the same state in order to synchronize them.

Figure 11:
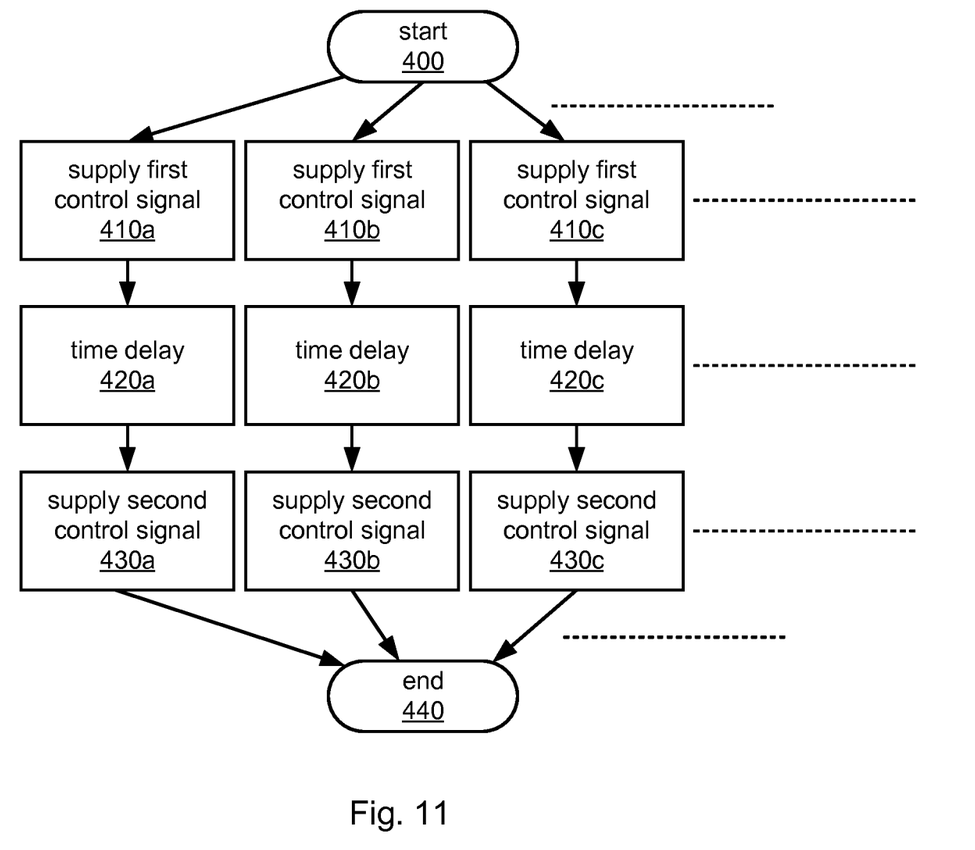
FIG. 11 shows a flowchart.

According to some embodiments, there is provided a method controlling the communication apparatus (e.g. radio base station 1) described above. The method may e.g. be performed by the control circuit 40. The method comprises supplying the first control signal and supplying the second control signal, with a time delay between them, to the modulator circuit 80 of the frequency synthesizer circuit 20a-c in each communication circuit 10a-c with different time delays for different communication circuits 10a-c. A flowchart of an embodiment of the method is shown in FIG. 11. The operation is started in step 400. In step 410i, the first control signal is supplied to the modulator circuit 80 of the frequency synthesizer 20i of the communication circuit 10i, where i=a, b, c, . . . . In step 420i, the operation waits for a time delay. Different time delays are used for different i:s. In step 430i, the second control signal is supplied to the modulator circuit 80 of the frequency synthesizer 20i of the communication circuit 10i. The operation is ended in step 440.

As mentioned above, in some embodiments, the first control signal is supplied to each of the modulation circuits at the same time instant, whereas the second control signal is supplied to different modulation circuits at different time instants.

As also mentioned above, in some embodiments, the first control signal is supplied to different modulation circuits at different time instants, whereas the second control signal is supplied to each of the modulation circuits at the same time instant.

Above it is described that, for different communication circuits 10a-c of the plurality of communication circuits, the delay time between the first and the second control signal is different. It should be noted that this does not exclude that there could be groups of communication circuits for which the delay time is the same, e.g. using the same first and second control signal for all communication circuits in the group. For example, in some embodiments, there may be an additional plurality (not shown in the figures) of communication circuits (i.e. in addition to the plurality of communication circuits 10a-c). The additional plurality of communication circuits may comprise one or more communication circuits that forms such a group with the communication circuit 10a. Similarly, the additional plurality of communication circuits may comprise one or more communication circuits that forms such a group with the communication circuit 10b. Moreover, the additional plurality of communication circuits may comprise one or more communication circuits that forms such a group with the communication circuit 10c, etc.

The present disclosure has been presented above with reference to specific embodiments. However, other embodiments than the above described are possible within the scope of the disclosure. Different method steps than those described above, performing the method by hardware or software, may be provided within the scope of the disclosure. The different features and steps of the embodiments may be combined in other combinations than those described.

The invention claimed is:

1. A fractional-N frequency synthesizer circuit, comprising:
a frequency divider circuit configured to:
receive a first oscillation signal having a first frequency,
receive a control word indicating a divisor, and
frequency divide the first oscillation signal with the divisor to generate a second oscillation signal having a second frequency, lower than the first frequency; and
a modulator circuit configured to generate a sequence of control words and output the sequence of control words to the frequency divider circuit, wherein
the modulator circuit comprises a set of memory elements, configured to store an internal state of the modulator circuit in response to a first control signal and to restore the internal state of the modulator circuit in response to a second control signal, the internal state of the modulator circuit being restored to a value that the internal state had when the first control signal was applied to the modulator circuit, thereby enabling a time shift of the sequence of control words.

2. The fractional-N frequency synthesizer circuit according to claim 1, wherein the modulator circuit is configured to set the internal state to a default state in response to a reset signal.

3. The fractional-N frequency synthesizer circuit according to claim 1, further comprising a set of delay elements, wherein the internal state is represented with contents of the delay elements in the set of delay elements.

4. The fractional-N frequency synthesizer circuit according to claim 3, wherein, for each delay element in the set of delay elements, the set of memory elements comprises an associated memory element connected to that delay element and is configured to store the content of that delay element in response to the first control signal.

5. The fractional-N frequency synthesizer circuit according to claim 4, further comprising a set of multiplexers, wherein, for each delay element in the set of delay elements, the set of multiplexers comprises an associated multiplexer connected to an input of that delay element and is configured to supply the content of the associated memory element to the input of the delay element in response to the second control signal.

6. The fractional-N frequency synthesizer circuit according to claim 1, wherein the fractional-N frequency synthesizer circuit is a phase-locked loop (PLL) circuit, comprising:
a controllable oscillator configured to generate the first oscillation signal; and
a phase detector configured to receive the second oscillation signal at a first input and to receive a reference oscillation signal at a second input.

7. A communication circuit comprising the fractional-N frequency synthesizer circuit according to claim 1, configured for generating a local oscillator signal of the communication circuit.

8. The communication circuit according to claim 7, wherein the communication circuit is a transmitter circuit, a receiver circuit, or a transceiver circuit.

9. A communication apparatus comprising a plurality of communication circuits according to claim 7.

10. The communication apparatus according to claim 9, further comprising a control circuit configured to supply the first control signal and the second control signal, with a time delay between them, to the modulator circuit of the fractional-N frequency synthesizer circuit in each communication circuit with different time delays for different communication circuits.

11. The communication apparatus according to claim 10, wherein the control circuit is further configured to:
supply the first control signal to each modulator circuit at the same time instant, and supply the second control signal to different modulator circuits at different time instants.

12. The communication apparatus according to claim 10, wherein the control circuit is further configured to:
supply the first control signal to different modulator circuits at different time instants, and
supply the second control signal to each modulator circuit at the same time instant.

13. The communication apparatus according to claim 9, wherein the communication apparatus is a radio base station for a cellular communications system.

14. A method of controlling a communication apparatus comprising a plurality of communication circuits, each communication circuit comprising a fractional-N frequency synthesizer circuit for generating a local oscillator signal of the communication circuit, wherein the fractional-N frequency synthesizer circuit comprises a frequency divider circuit configured to receive a first oscillation signal having a first frequency, to receive a control word indicating a divisor, and to frequency divide the first oscillation signal with the divisor to generate a second oscillation signal having a second frequency lower than the first frequency, wherein the fractional-N frequency synthesizer circuit also comprises a modulator circuit configured to generate a sequence of control words and to output the sequence of control words to the frequency divider circuit, wherein the modulator circuit comprises a set of memory elements configured to store an internal state of the modulator circuit in response to a first control signal and to restore the internal state of the modulator circuit in response to a second control signal, thereby enabling a time shift of the sequence of control words, and wherein the method comprises:
supplying the first control signal and supplying the second control signal, with a time delay between them, to the modulator circuit of the fractional-N frequency synthesizer circuit in each communication circuit, with different time delays for different communication circuits, wherein the internal state of the modulator circuit is restored, in response to the second control signal, to a value that the internal state had when the first control signal was applied to the modulator circuit.

15. The method according to claim 14, wherein supplying the first control signal and the second control signal comprises:
supplying the first control signal to each modulator circuit at the same time instant; and
supplying the second control signal to different modulator circuits at different time instants.

16. The method according to claim 14, wherein supplying the first control signal and the second control signal comprises:
supplying the first control signal to different modulator circuits at different time instants; and
supplying the second control signal to each modulator circuit at the same time instant.

* * * * *